(12) United States Patent
Mosier

(10) Patent No.: US 10,184,607 B2
(45) Date of Patent: Jan. 22, 2019

(54) OPEN FRAME, PARALLEL, TWO AXIS FLEXURE STAGE WITH YAW COMPENSATION

(71) Applicant: Aerotech, Inc., Pittsburgh, PA (US)

(72) Inventor: Evan Mosier, Pittsburgh, PA (US)

(73) Assignee: Aerotech, Inc., Pittsburgh, PA (US)

( * ) Notice: Subject to any disclaimer, the term of this patent is extended or adjusted under 35 U.S.C. 154(b) by 491 days.

(21) Appl. No.: 15/157,866

(22) Filed: May 18, 2016

(65) Prior Publication Data
US 2017/0336017 A1    Nov. 23, 2017

(51) Int. Cl.

| | | |
|---|---|---|
| *H01L 41/09* | (2006.01) |
| *F16M 11/12* | (2006.01) |
| *F16M 11/18* | (2006.01) |
| *B81B 3/00* | (2006.01) |
| *H02N 2/00* | (2006.01) |
| *H02N 2/04* | (2006.01) |
| *B23Q 1/25* | (2006.01) |

(52) U.S. Cl.
CPC ......... *F16M 11/125* (2013.01); *B81B 3/0062* (2013.01); *F16M 11/18* (2013.01); *H02N 2/0095* (2013.01); *H02N 2/043* (2013.01); *H02N 2/046* (2013.01); *B23Q 1/25* (2013.01); *B23Q 2210/002* (2013.01)

(58) Field of Classification Search
CPC .... F16M 11/125; F16M 11/18; B81B 3/0062; H02N 2/0095; H02N 2/043; B23Q 1/25; B23Q 2210/002
USPC ................................................ 310/311, 328
See application file for complete search history.

(56) References Cited

U.S. PATENT DOCUMENTS

| | | | | |
|---|---|---|---|---|
| RE25,597 E | * | 6/1964 | Dieter | ...................... H04R 1/16 369/138 |
| 4,694,477 A | | 9/1987 | Siddall | |
| 5,903,085 A | * | 5/1999 | Karam | ................... B82Y 35/00 310/328 |

(Continued)

FOREIGN PATENT DOCUMENTS

CN        101738855 A       6/2010

OTHER PUBLICATIONS

Yangmin et al., Development and Assessment of a Novel Decouples XY Parallel Micropositioning Platform, ASME Transactions Mechatronics, Feb. 2010, pp. 125-135, vol. 15, No. 1.

(Continued)

*Primary Examiner* — Thomas Dougherty
(74) *Attorney, Agent, or Firm* — The Webb Law Firm

(57) ABSTRACT

Disclosed is a stage system comprising at least one flexure frame having a fixed center and movable distal ends configured to displace a tabletop operatively connected thereto along at least one axis of movement and at least two actuators comprising a first actuator and a second actuator positioned within the at least one flexure frame. The first actuator is positioned within the at least one flexure frame at a first angle of deflection from at least one beam of the at least one flexure frame and the second actuator is positioned within the at least one flexure frame at a second angle of deflection from the at least one beam. The at least two actuators are configured to produce a compensating displacement to offset yaw error as the at least two actuators expand from a contracted first position to an expanded second position.

20 Claims, 5 Drawing Sheets

(56) References Cited

U.S. PATENT DOCUMENTS

| | | |
|---|---|---|
| 5,982,128 A | 11/1999 | Lee |
| 6,310,750 B1 | 10/2001 | Hawwa et al. |
| 6,648,509 B2 | 11/2003 | Watson |
| 6,791,669 B2 | 9/2004 | Poon |
| 2002/0005679 A1 | 1/2002 | Elings et al. |
| 2004/0138766 A1 | 7/2004 | Pahk et al. |
| 2004/0160118 A1* | 8/2004 | Knollenberg .......... G02B 26/06 303/113.1 |
| 2005/0231075 A1 | 10/2005 | Xu |
| 2010/0116161 A1 | 5/2010 | Shilpiekandula et al. |
| 2012/0108980 A1* | 5/2012 | Shilling ............... A61B 8/0883 600/466 |
| 2014/0312246 A1* | 10/2014 | Takahashi ............... H01J 37/20 250/453.11 |
| 2015/0047078 A1* | 2/2015 | Sarkar ................. G01Q 10/045 850/1 |

OTHER PUBLICATIONS

Arai et al., Development of 3 DOF Micro Finger, Intelligent Robots and Systems, 1996, pp. 981-987.

* cited by examiner

OPEN FRAME, PARALLEL, TWO AXIS FLEXURE STAGE WITH YAW COMPENSATION

BACKGROUND OF THE INVENTION

Field of the Invention

Disclosed embodiments relate generally to a stage system with actuators and a moving tabletop that compensates for and corrects yaw error during tabletop displacement by producing a compensating differential displacement to offset yaw error.

Description of Related Art

Small-scale positioning systems, i.e., nanopositioners, are widely used in a number of research and industrial fields, including biomedical engineering, electronic manufacturing, and semiconductor fabrication. These positioning systems must have carefully controlled movements over minute distances so that inspection or assembly can be both quick and precise. One particularly important implementation of small-scale positioning systems is the use of flexure stages. Flexure stages make use of actuators deployed in flexure frames to control the displacement of a moving tabletop. A single actuator can be used to move the tabletop along an axis, but the actuator may produce small errors in displacement unless anchored or guided by other elements.

FIG. 1 depicts one such single-actuator-per-axis prior art direct-drive flexure stage system. Shown is an open frame parallel kinematic flexure stage, including a stationary reference frame 102, a moving tabletop 104, two orthogonal actuators 106, and two position sensors 108. The actuators 106 expand along their length when energized, moving the tabletop 104. The position sensors 108 sense the displacement caused by the actuators 106. Motion is generated by connecting each actuator 106 to separate electronic amplifiers (not shown), which are controlled by computer software. The actuators 106 and sensors 108 are in parallel, meaning they are all directly connected to the stationary frame 102. The intended use for this type of stage is to position a sample attached to the tabletop 104 with two degrees of freedom so it can be measured by a sensor or acted on by a machine tool. The aperture in the tabletop 104 allows the sample to be accessed from both sides. This prior art stage system is susceptible to imprecision due to geometric errors that are induced in each axis through cross-coupling with the actuation mechanism of the other axis.

Two or more actuators can be deployed to reduce the errors of a single actuator. When two actuators are deployed in concert within a flexure to produce movement along a single axis, more precise movement can be achieved. However, tandem actuators may still produce small errors due to the counteracting transverse forces produced by lengthening actuators. In particular, the counteracting forces may produce rotation about the axis perpendicular to the tabletop, which is known as yaw error. Displacement error due to yaw error may be small at the center of the tabletop, but small errors of rotation can lead to even greater displacement errors at the edges of the tabletop, which may lead to increasing costs of manufacturing, lowered efficiency in production, or even waste by misassembled product.

FIG. 2 depicts a prior art stage system having two actuators 106 per axis of movement. The actuators 106 in the flexure frame 110 at the bottom of FIG. 2 are configured to cause displacement along Axis A, and the actuators 106 in the flexure frame 110 on the right side of FIG. 2 are configured to cause displacement along Axis B. Each axis of movement is perpendicular to the other. Extension arms 112 are employed to link a tabletop 104 to the flexure frames 110. Inherent with this design is rotational error about Axis C, i.e., yaw error, created by activation of the actuators 106 with a flexure frame 110. As shown, the system is shifted in position from state "a" to state "b" when the actuators 106 for Axis A, at the bottom of FIG. 2, are expanding. The extension arms 112 connecting to the flexure frames 110 housing the actuators 106 for Axis A cause the tabletop 104 to yaw from 104a to 104b. As shown, the unexpanded actuators 106a for Axis A are activated with an electrical signal, causing them to expand to 106b and displace the flexure frame 110 from 110a to 110b and the extension arms 112 from 112a to 112b. For actuators that are piezoelectric actuators, the electrical signal may be an applied voltage, which causes the piezoelectric actuators to expand in proportion to the applied voltage. The yaw error shifts the system's elements out of position, including the unexpanded actuators 106 for Axis B and their respective flexure frame 110. As exemplified in FIG. 2, yaw error can cause detrimental imprecision during nanoscale inspection or manufacturing processes.

Accordingly, there is a need in the art for a stage system with actuators that compensates for and corrects yaw error during tabletop displacement.

SUMMARY OF THE INVENTION

Generally, provided is a stage system for moving a tabletop along at least one axis of movement using at least two actuators within a flexure frame and eliminating yaw error through the positioning of the at least two actuators.

According to a preferred non-limiting embodiment or aspect, provided is a stage system that includes at least one flexure frame having a fixed center and movable distal ends configured to displace a tabletop operatively connected thereto along at least one axis of movement. The at least two actuators include a first actuator and a second actuator positioned within the at least one flexure frame. The first actuator is positioned within the at least one flexure frame at a first angle of deflection from at least one beam of the at least one flexure frame and the second actuator is positioned within the at least one flexure frame at a second angle of deflection from the at least one beam of the at least one flexure frame.

In a preferred non-limiting embodiment or aspect, the at least two actuators each may be configured to expand from a contracted first position to an expanded second position, the first angle being less than the second angle. The at least two actuators each may expand at least partially along the at least one axis of movement and at least partially away from the other actuator. The system may further include at least two extension arms, each extension arm attached at a first end to the at least one flexure frame and at a second end to the tabletop. The at least two extension arms may be configured to displace the tabletop along the at least one axis of movement as the at least two actuators expand from the contracted first position to the expanded second position.

In a preferred non-limiting embodiment or aspect, the tabletop may be configured to be displaced along two axes of movement of the at least one axis of movement. The at least one flexure frame may be a first flexure frame and a second flexure frame, the first flexure frame positioned at approximately 90° to the second flexure frame and on an adjacent side of the tabletop to the second flexure frame. The at least two actuators may be configured to produce compensating differential displacement to offset yaw error as the at least two actuators expand from a contracted first position to an expanded second position.

In a preferred non-limiting embodiment or aspect, the at least two actuators may have spherical caps on each end of each actuator or flexure hinges that permit the at least two actuators to rotate as the at least two actuators expand from the contracted first position to the expanded second position. The at least two actuators may expand from the contracted first position to the expanded second position in response to an application of an electrical signal. An extension arm may be attached to each end of the at least one flexure frame, the at least one flexure frame being further configured to deflect the distal ends away from the tabletop as the at least two actuators expand from the contracted first position to the expanded second position.

According to another preferred non-limiting embodiment or aspect, provided is a method of operating a stage system comprising a movable tabletop. The method includes applying a first electrical signal to at least two actuators comprising a first actuator and a second actuator positioned within at least one flexure frame. The at least one flexure frame has a fixed center and movable distal ends configured to displace the tabletop operatively connected thereto along at least one axis of movement. The first actuator is positioned within the at least one flexure frame at a first angle of deflection from at least one beam of the at least one flexure frame and the second actuator is positioned within the at least one flexure frame at a second angle of deflection from the at least one beam of the at least one flexure frame. The method further includes, in response to applying the first electrical signal, measuring a first displacement of the tabletop along the at least one axis of movement using at least one position sensor, the first displacement comprising a differential displacement between the distal ends of the at least one flexure frame.

In a preferred non-limiting embodiment or aspect, the at least two actuators may be configured to expand from a contracted first position to an expanded second position in response to applying the first electrical signal. The first angle may be less than the second angle. The at least two actuators each may expand at least partially along the at least one axis of movement and at least partially away from the other actuator in response to applying the first electrical signal. The system to be operated may have at least two extension arms, each extension arm attached at a first end to the at least one flexure frame and at a second end to the tabletop. The at least two extension arms may be configured to displace the tabletop along the at least one axis of movement as the at least two actuators expand from the contracted first position to the expanded second position.

In a preferred non-limiting embodiment or aspect, the method may further include applying a second electrical signal to a third actuator and a fourth actuator of the at least two actuators. The third actuator and the fourth actuator may be positioned in a second flexure frame of the at least one flexure frame. The second flexure frame may be positioned at approximately 90° to a first flexure frame of the at least one flexure frame and on an adjacent side of the tabletop to the first flexure frame.

In a preferred and non-limiting embodiment or aspect, the at least two actuators may be configured to produce a compensating differential displacement to offset yaw error as the at least two actuators expand from a contracted first position to an expanded second position. The method may further include, in response to applying the second electrical signal, measuring a second displacement of the tabletop along a second axis of movement of the at least one axis of movement using a second position sensor of the at least one position sensor. The second displacement may include a differential displacement between the distal ends of the second flexure frame. The method may further include, in response to measuring the first displacement and the second displacement, varying the first electrical signal or the second electrical signal.

According to another preferred non-limiting embodiment or aspect, provided is a stage system including a stationary reference frame, a tabletop configured to be displaced along at least one axis of movement, and at least one flexure frame having a center affixed to the stationary reference frame and distal ends that are movable with respect to the stationary reference frame. The system also includes at least two actuators including a first actuator and a second actuator, the at least two actuators each configured to expand from a contracted first position to an expanded second position. The at least two actuators are further positioned in the at least one flexure frame at a small angle of deflection from at least one beam of the at least one flexure frame. The first actuator and second actuator have different angles, and each actuator is positioned such that as it expands from the contracted first position to the expanded second position, it expands at least partially along the at least one axis of movement and at least partially away from the other actuator. The system further includes at least two extension arms, each extension arm attached at a first end to the at least one flexure frame and at a second end to the tabletop. The extension arms are configured to displace the tabletop along the at least one axis of movement as the at least two actuators expand from the contracted first position to the expanded second position.

In a preferred non-limiting embodiment or aspect, the at least two actuators may have spherical caps on each end of each actuator or flexure hinges that permit the at least two actuators to rotate as the at least two actuators expand from the contracted first position to the expanded second position. The at least two actuators may expand from the contracted first position to the expanded second position in response to an application of an electrical signal. An extension arm may be attached to each end of the at least one flexure frame, the at least one flexure frame being further configured to deflect the distal ends away from the tabletop as the at least two actuators expand from the contracted first position to the expanded second position. The at least two actuators may be configured to produce a compensating differential displacement to offset yaw error as the at least two actuators expand from the contracted first position to the expanded second position.

These and other features and characteristics of the present invention, as well as the methods of operation and functions of the related elements of structures and the combination of parts and economies of manufacture, will become more apparent upon consideration of the following description and the appended claims with reference to the accompanying drawings, all of which form a part of this specification, wherein like reference numerals designate corresponding parts in the various figures. It is to be expressly understood, however, that the drawings are for the purpose of illustration and description only and are not intended as a definition of the limits of the invention. As used in the specification and the claims, the singular form of "a", "an", and "the" include plural referents unless the context clearly dictates otherwise.

DETAILED DESCRIPTION OF THE INVENTION

Figure 1:
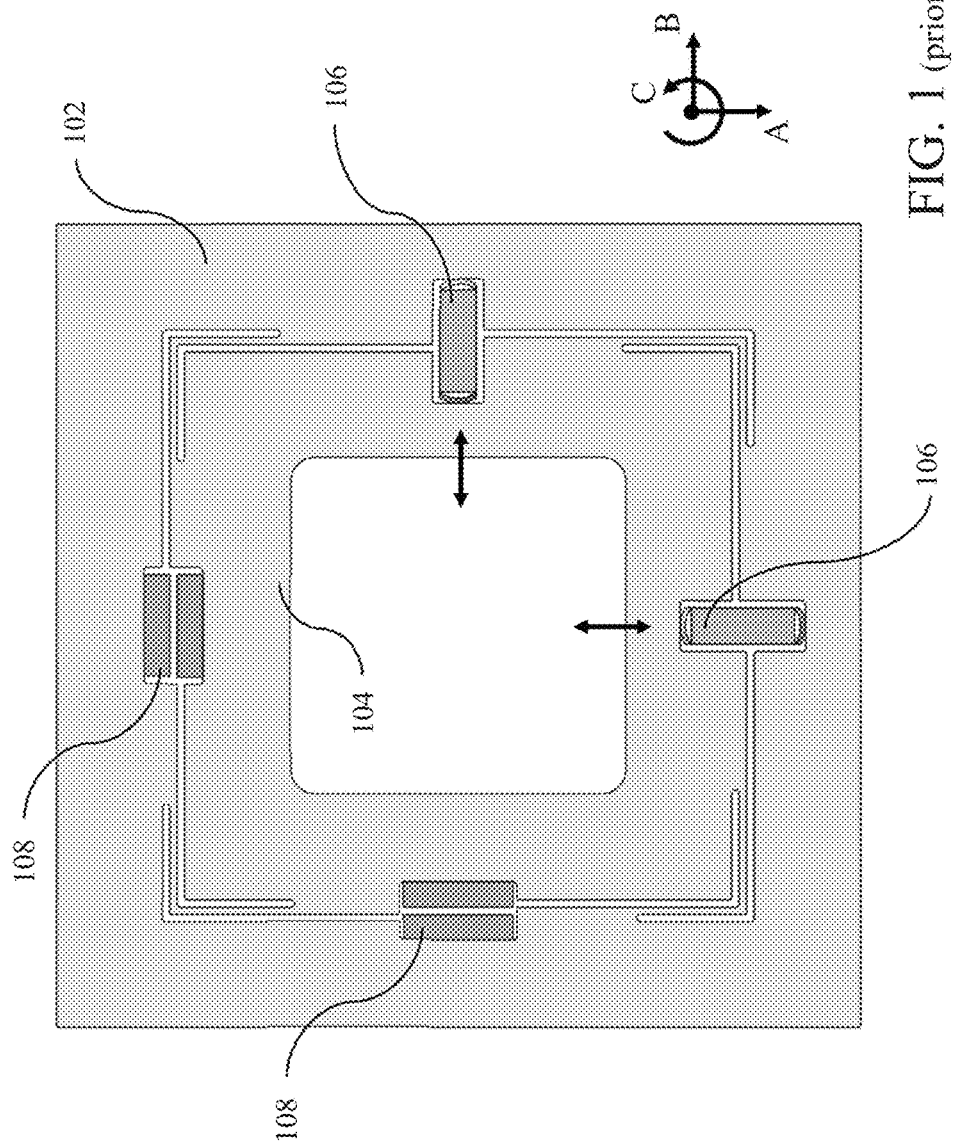
FIG. 1 is a schematic diagram of a prior art stage system having one actuator per axis of displacement.

For purposes of the description hereinafter, the terms "upper", "lower", "right", "left", "vertical", "horizontal", "top", "bottom", "lateral", "longitudinal" and derivatives thereof shall relate to the invention as it is oriented in the drawing figures. However, it is to be understood that the invention may assume various alternative variations and step sequences, except where expressly specified to the contrary. It is also to be understood that the specific devices and process illustrated in the attached drawings, and described in the following specification, are simply exemplary embodiments of the invention. Hence, specific dimensions and other physical characteristics related to the embodiments disclosed herein are not to be considered as limiting.

The present disclosure is directed to an open frame, parallel kinematic, two axis flexure stage system with asymmetric flexure frames that compensate for yaw inherent in the stage design. Each axis moves perpendicular to the other and uses extension arms that link a tabletop and an actuated flexure frame to push and pull the tabletop. When an axis is moving, the extension arms from the perpendicular axis cause the tabletop to yaw. The asymmetric flexure frames are designed with a differential expansion which induces yaw in the opposite direction. The yaw error from the extension arms and the differential flexure cancel each other to yield rotation-free motion.

Figure 3:
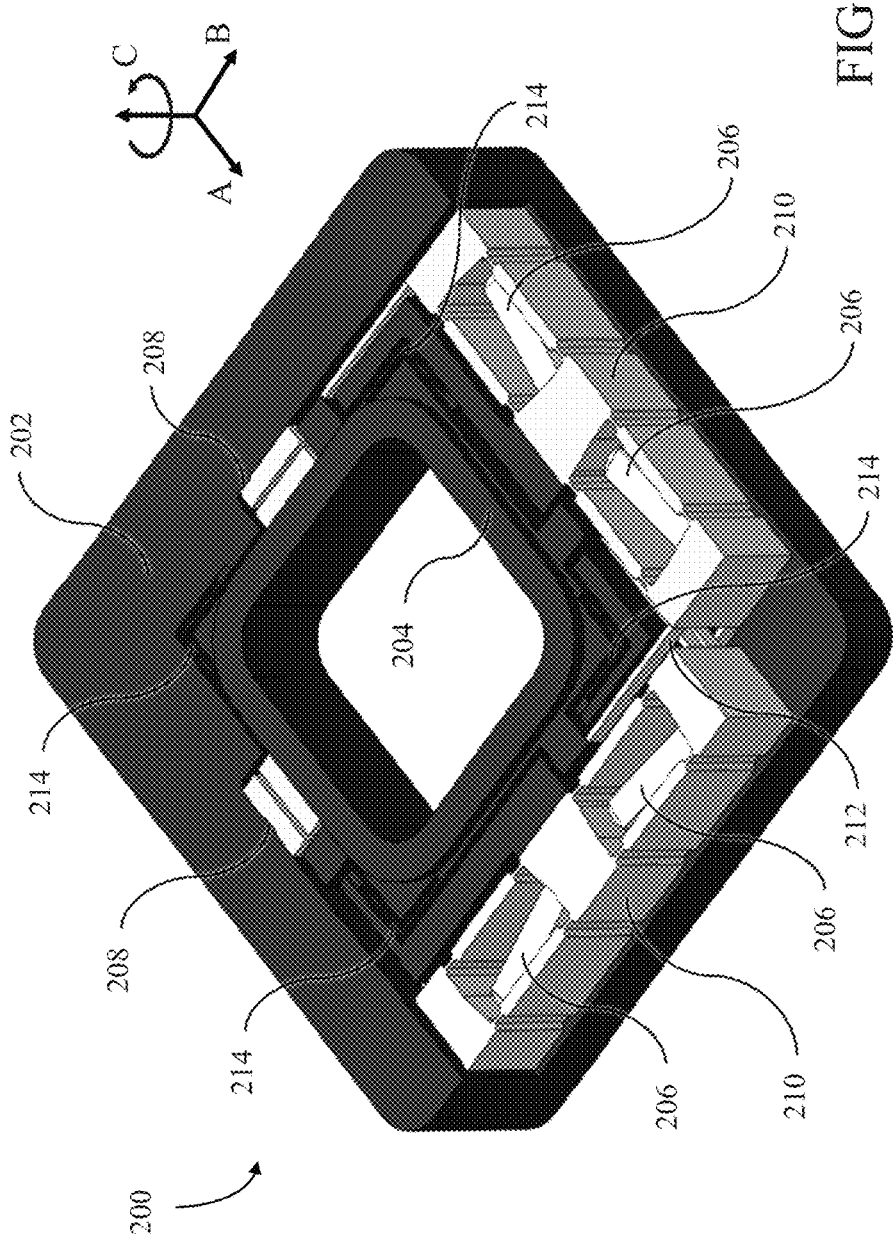
FIG. 3 is an isometric perspective view of one embodiment or aspect of a stage system, according to the principles of the invention.
Figure 4:
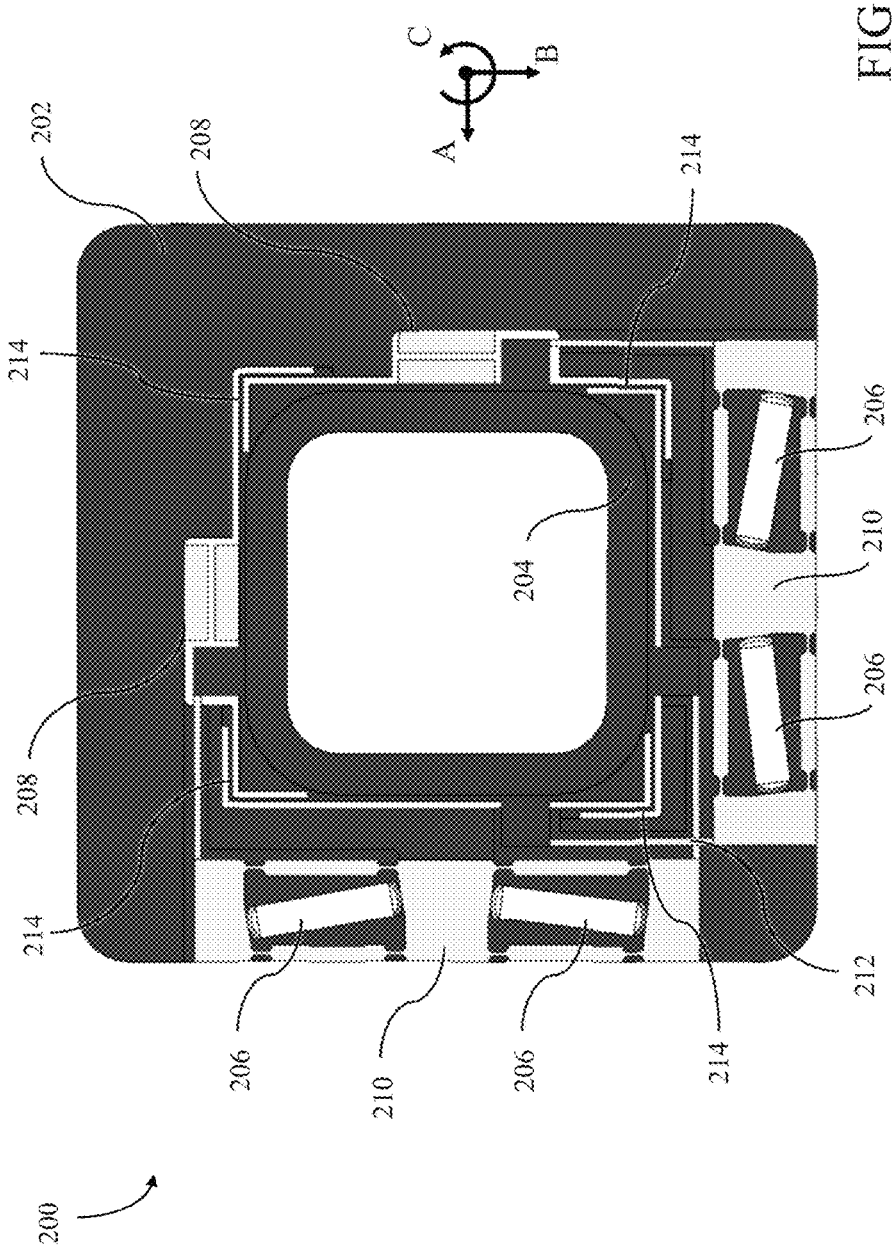
FIG. 4 is a top-down perspective view of one embodiment or aspect of a stage system, according to the principles of the invention.

With specific reference to FIG. 3 and FIG. 4, shown are an isometric perspective view and a top-down perspective view of a stage system 200, according to preferred and non-limiting embodiments or aspects of the present invention. The stage system 200 may be a device and/or assembly by which an object is positioned and manipulated during an inspection, assembly, or manufacturing process. In one example, the stage system 200 may include a tabletop 204 and one or more elements for nanopositioning an object. For example, "nanopositioning" and "nanopositioners" may include methods or devices for tilting, rotating, or translating an object by highly precise changes in positioning. Typically, these changes in positioning are orchestrated on a micrometer or nanometer scale.

Depicted in FIGS. 3 and 4 is a stationary reference frame 202 that serves as a base for the system components. Interior to the stationary reference frame 202 is a moving tabletop 204, which includes an aperture that allows access to the stage payload from both sides of the tabletop 204. The tabletop 204 may be any frame upon which an object may be positioned during inspection, assembly, or manufacturing processes. In one example, with specific regard to semiconductor wafer assembly, particularly during photolithography, the tabletop 204 is a movable frame which can be manipulated on a micrometer or nanometer scale. Other configurations are possible.

In the depicted embodiment, shown are four actuators 206 that are configured to displace the tabletop 204. The actuators 206 expand or contract in reaction to an applied electrical signal. As shown, the actuators 206 may be piezoelectric multilayer stack actuators that expand or contract along their long axis in proportion to applied voltage from an electrical amplifier. It will be appreciated that other expanding actuators may be employed, including magnetic voice coils, ferroelectric actuators, and/or the like. The actuators 206 are positioned in flexure frames 210 that expand or contract with the motion of the actuators 206. As shown, two actuators 206 are mounted in each of two flexure frames 210. The pair of actuators 206 along each axis is wired on both sides into a single electrical amplifier (not shown) so that they can be driven together, each pair of actuators 206 having a separate amplifier. The direction of motion of the flexure frame 210 is along the length of extension arms 212 perpendicular to the mounting surface of the flexure frame 210. The Axis A and Axis B flexure frames 210 are mounted in parallel, meaning they each are connected to the stationary reference frame 202 and connect directly to the moving tabletop 204. As an example embodiment or aspect, partially spherical caps are placed on each end of each actuator 206 to allow small rotations relative to the flexure frame 210. It will be appreciated that other elements may be used to accommodate rotation, such as flexure pivots, flexure hinges, cup and ball joints, and/or the like. For very small displacements, it may also be possible to have the flat faces of the actuators 206 in direct contact with the flexure frame 210.

With further reference to FIG. 3 and FIG. 4, and in further preferred and non-limiting embodiments or aspects, the extension arms 212 link the flexure frame 210 to the tabletop 204. The extension arms 212 are stiff in the direction of motion, i.e., along their long axis, but flexible in the transverse direction to allow motion of the opposite axis. The extension arms 212 from one axis cross the arms from the other. To avoid interference, each set of extension arms 212 is offset from the other. As an example, the extension arms 212 are depicted as long, thin beams. It will be appreciated, however, that the extension arms 212 may take other forms, such as round rods, wire flexures, dual flexure hinges, and/or the like. Other configurations are possible.

With further reference to FIG. 3 and FIG. 4, and in further preferred and non-limiting embodiments or aspects, a position sensor 208 measures the location of each axis. As shown, the position sensors 208 are two-sided capacitance sensors, but it will be appreciated that the position sensors 208 may be any number of displacement sensors, including eddy current sensors, laser with a target sensors, single-ended capacitance sensors, strain gages, and/or the like. It will also be appreciated that these varying sensor types may be used in combination. The preferred location for the position sensors 208 is in the center of the tabletop 204, because this location is in line with the center of motion of the tabletop 204 and is less sensitive to Abbe errors than it would be if the sensor 208 was off center. Abbe errors are linear errors caused by rotational errors at a distance. The sensors 208 may be placed in other functional positions without departing from the spirit of the invention. The two position sensors 208 are mounted in parallel, meaning they both reference the stationary reference frame 202 and measure directly on the tabletop 204. The position sensors 208 may be used to sense the displacement of the tabletop 204 when actuators 206 are applied with an electrical signal, and the electrical signal being applied to the actuators 206 may be varied based on the displacement of the tabletop 204 determined by the position sensors 208.

With further reference to FIG. 3 and FIG. 4, and in further preferred and non-limiting embodiments or aspects, flexure bearings 214 support the tabletop 204 and add stiffness in the Axis C direction, which is a common loading direction in typical flexure stage applications. The flexure bearings 214 are depicted as four folded leaf flexures, one folded leaf flexure at each corner of the tabletop 204. It will be appreciated that other configurations of flexure bearings 214 are possible, including, but not limited to, using multiple parallel folded leaf flexures or stiffening the extension arms 212 in the Axis C direction to allow them to support the tabletop 204 without an additional flexure bearing 214. It is also possible to use more traditional bearings, such as mechanical roller bearings or air bearings to create a similar support for the tabletop 204. Other configurations are possible.

A flexure frame 210 with two partially-opposing actuators 206 has an inherent source of yaw. When one axis moves, the extension arms 212 from the opposite axis move laterally with it. The transverse motion of the extension arms 212 imparts a force on the moving axis ($F_{transverse}$) equal to the transverse stiffness of the extension arms 212 ($K_{transverse}$) multiplied by the displacement of the moving axis ($d_{axis}$).

$$F_{transverse} = K_{transverse} \, d_{axis}$$

$F_{transverse}$ does not act through the center of the flexure frame 210, i.e., the location of the center of stiffness, so it will impart a moment on the tabletop 204 in proportion to the offset distance between where the extension arms 212 join the tabletop 204 and the tabletop 204 center ($d_{off}$).

The extension arms 212 are mounted with a fixed constraint on both sides so an additional bending moment will be generated as a reaction to the constraint as the extension arms 212 are moved. This moment will depend on the extension arm 212 design. For a homogenous extension arm 212 of constant cross section and a length of $L_{arm}$, the total moment imparted to the tabletop 204 ($M_{transverse}$) for the design shown in FIG. 3 and FIG. 4 will be:

$$M_{transverse} = F_{transverse} \, d_{off} + \tfrac{1}{2} F_{transverse} L_{arm}$$

Figure 2:
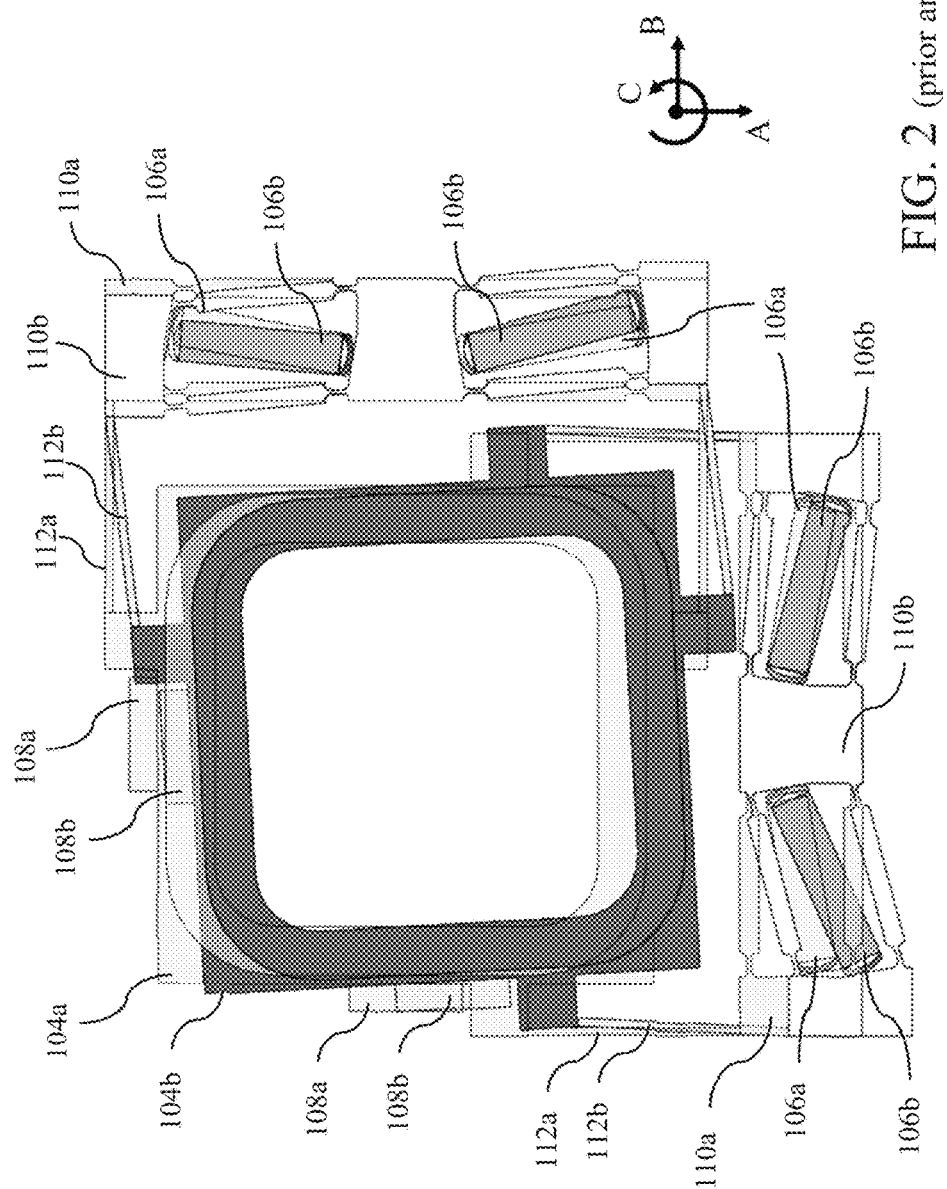
FIG. 2 is a schematic diagram of a prior art stage system having two actuators per axis of displacement.

This moment will cause a yaw error ($\Theta_{C,err}$) about Axis C, shown in FIGS. 2-4, inversely proportional to the rotational stiffness of the entire stage system ($K_{\Theta C,sys}$) as described by the angular form of Hooke's Law:

$$\theta_{C,err} = \frac{M_{transverse}}{K_{\theta C,sys}}$$

Figure 5:
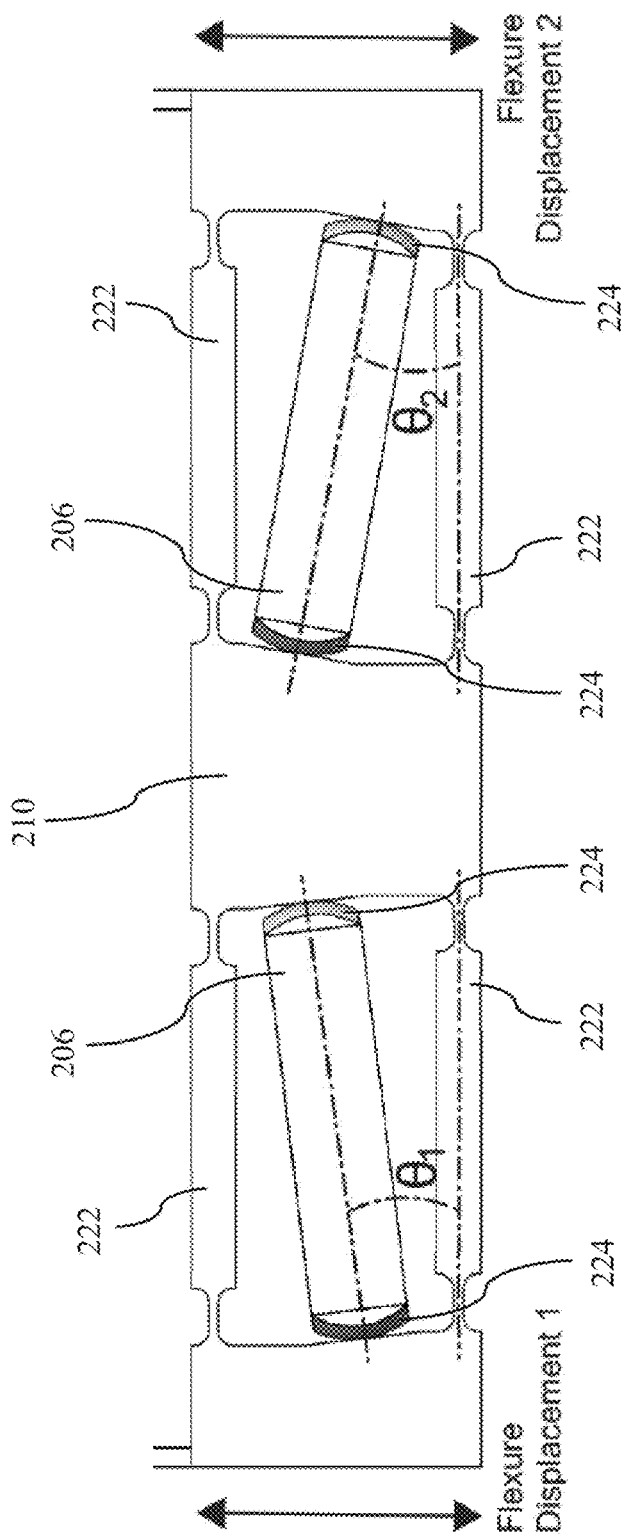
FIG. 5 is a schematic diagram of one embodiment or aspect of a stage system, according to the principles of the invention.

With specific reference to FIGS. 3-5, the invention compensates for and corrects the yaw error caused by the extension arms 212, according to a preferred and non-limiting embodiment or aspect. Instead of flexure frame 210 with symmetric actuator 206 positioned on each side, the flexure frame 210 is designed to be asymmetric. The side in line with the extension arms 212 from the opposite axis expands more than the side away from the extension arms 212 from the opposite axis, hereinafter referred to as "differential expansion." This creates an opposite rotational error proportional to the displacement. If the relative expansion of each side is selected properly, it will create an opposite rotational error that will cancel out the yaw error from the opposite axis's extension arms 212 and the tabletop 204 will have no yaw error at any point in travel.

The relative displacement differential ($d_{diff}$) required to completely compensate for the yaw error can be calculated by treating the flexure frame 210 and the entire stage system 200 as rotational springs, then looking at the average of the two springs and setting this equal to the error from the extension arms 212. To do this, the rotational angle between the high and low displacement sides is defined as:

$$\theta_{diff} = \arctan\left(\frac{d_{diff}}{w_{arms}}\right)$$

Where $w_{arms}$ is the width between the two extension arm 212 pairs across the flexure frame 210. The induced yaw error from the differential expansion is the average of the rotational stiffnesses of one flexure frame 210 and the entire system 200:

$$\theta_{err,induced} = \frac{\theta_{diff} K_{\theta C,flexure}}{K_{\theta C,sys}} = \frac{\arctan\left(\frac{d_{diff}}{w_{arms}}\right) K_{\theta C,flexure}}{K_{\theta C,sys}}$$

Setting the induced error equal to the extension arm 212 error derived previously yields:

$$\theta_{err,induced} = \theta_{C,err}$$

$$\frac{\arctan\left(\frac{d_{diff}}{w_{arms}}\right) K_{\theta C,flexure}}{K_{\theta C,sys}} = \frac{M_{transverse}}{K_{\theta C,sys}}$$

$$d_{diff} = w_{arms} \tan\left(\frac{M_{transverse}}{K_{\theta C,flexure}}\right)$$

If $\Theta_{diff}$ is small, the small angle approximation can be used to simplify the equation to:

$$d_{diff} \approx \frac{w_{arms} M_{transverse}}{K_{\theta C,flexure}}$$

With further reference to FIG. 5, and in further preferred and non-limiting embodiments or aspects, the design of the flexure frame 210 can take a variety of forms as long as one side expands more than the other. As shown in one example, two identical actuators 206 are each set at angles $\Theta_1$, $\Theta_2$ relative to two parallel beams 222, such that the flexure frame 210 has four parallel beams in total. It will be appreciated that parallel beams 222 may also be positioned at an angle relative to a horizontal actuator 206. When the actuators 206 change length in response to an electrical signal, the parallel beams 222 will translate up or down to adjust. The result is an amplification of the actuator 206 displacement, where the displacement of the flexure frame 210 at the extension arm 212 interface is greater than the actuator 206 displacement. The shallower the angle of the actuator 206 relative to the beams 222, the more flexure frame 210 displacement will result from a given actuator 206 displacement. Therefore, the larger expansion side of the asymmetric flexure frame 210 has a shallower actuator 206 angle $\Theta_1$ than the smaller displacement side angle $\Theta_2$. It will be appreciated that other beam configurations are possible.

With further reference to FIG. 5, and in further preferred and non-limiting embodiments or aspects, when the actuators 206 change length and the flexure frame 210 shifts position, the moving walls will shift relative to the fixed center of the flexure frame 210. This will cause the actuators 206 to rotate within the flexure frame 210. As an example, the actuators 206 are depicted having spherical caps 224 that permit the actuators 206 to rotate in the flexure frame 210, but other shapes or configurations are possible, as described above.

In a further preferred and non-limiting embodiment or aspect, yaw error may be controlled by connecting each actuator in each side of the flexure frame 210 to a separate electrical amplifier. In this manner, each side of the flexure frame 210 may be controlled individually and actuated to adjust yaw. A processor operating on instructions saved in a computer-readable medium may employ an algorithm to synchronize the relative motion of the actuators 206 and achieve the desired expansion differential. As the expansion differential increases due to the expansion or contraction of one actuator 206, the complimentary actuator 206 may be expanded or contracted to counteract the yaw error of the flexure frame 210 and/or the system 200.

In a further preferred and non-limiting embodiment or aspect, yaw error may be controlled by increasing the extension arm length. If the extension arms 212 were extended past the center of the tabletop 204, a point could be reached where the counteracting moments balance each other and result in zero yaw. To accommodate the enlarged extension arms, the stage may also be enlarged to account for the mounting of the flexure frame 210 and extension arms 212 that extend past the center of the tabletop 204. Moreover, the position sensors 208 may be repositioned or reconfigured such that they are able to sense displacement of the enlarged extension arms 212.

Although the invention has been described in detail for the purpose of illustration based on what is currently considered to be the most practical and preferred and non-limiting embodiments, it is to be understood that such detail is solely for that purpose and that the invention is not limited to the disclosed embodiments, but, on the contrary, is intended to cover modifications and equivalent arrangements that are within the spirit and scope of the appended claims. For example, it is to be understood that the present invention contemplates that, to the extent possible, one or more features of any embodiment can be combined with one or more features of any other embodiment.

What is claimed is:

1. A stage system comprising:
   at least one flexure frame having a fixed center and movable distal ends configured to displace a tabletop operatively connected thereto along at least one axis of movement; and
   at least two actuators comprising a first actuator and a second actuator positioned within the at least one flexure frame,
   wherein the first actuator is positioned within the at least one flexure frame at a first angle of deflection from at least one beam of the at least one flexure frame and the second actuator is positioned within the at least one flexure frame at a second angle of deflection from the at least one beam of the at least one flexure frame.

2. The stage system of claim 1, wherein the at least two actuators each are configured to expand from a contracted first position to an expanded second position, the first angle being less than the second angle.

3. The stage system of claim 2, wherein the at least two actuators each expand at least partially along the at least one axis of movement and at least partially away from the other actuator.

4. The stage system of claim 2, further comprising at least two extension arms, each extension arm attached at a first end to the at least one flexure frame and at a second end to the tabletop, the at least two extension arms configured to displace the tabletop along the at least one axis of movement as the at least two actuators expand from the contracted first position to the expanded second position.

5. The stage system of claim 1, wherein the tabletop is configured to be displaced along two axes of movement of the at least one axis of movement, and wherein the at least one flexure frame is a first flexure frame and a second flexure frame, the first flexure frame positioned at approximately 90° to the second flexure frame and on an adjacent side of the tabletop to the second flexure frame.

6. The stage system of claim 1, wherein the at least two actuators are configured to produce a compensating differential displacement to offset yaw error as the at least two actuators expand from a contracted first position to an expanded second position.

7. The stage system of claim 6, wherein the at least two actuators have spherical caps on each end of each actuator or flexure hinges that permit the at least two actuators to rotate as the at least two actuators expand from the contracted first position to the expanded second position.

8. The stage system of claim 2, wherein the at least two actuators expand from the contracted first position to the expanded second position in response to an application of an electrical signal, wherein an extension arm is attached to each end of the at least one flexure frame, the at least one flexure frame being further configured to deflect the distal ends away from the tabletop as the at least two actuators expand from the contracted first position to the expanded second position.

9. A method of operating a stage system comprising a movable tabletop, the method comprising:
   applying a first electrical signal to at least two actuators comprising a first actuator and a second actuator positioned within at least one flexure frame, the at least one flexure frame having a fixed center and movable distal ends configured to displace the tabletop operatively connected thereto along at least one axis of movement, wherein the first actuator is positioned within the at least one flexure frame at a first angle of deflection from at least one beam of the at least one flexure frame and the second actuator is positioned within the at least one flexure frame at a second angle of deflection from the at least one beam of the at least one flexure frame, and
   in response to applying the first electrical signal, measuring a first displacement of the tabletop along the at least one axis of movement using at least one position sensor, the first displacement comprising a differential displacement between the distal ends of the at least one flexure frame.

10. The method of claim 9, wherein the at least two actuators are configured to expand from a contracted first position to an expanded second position in response to applying the first electrical signal, the first angle being less than the second angle.

11. The method of claim 10, wherein the at least two actuators each expand at least partially along the at least one axis of movement and at least partially away from the other actuator in response to applying the first electrical signal.

12. The method of claim 11, wherein the system to be operated has at least two extension arms, each extension arm attached at a first end to the at least one flexure frame and at a second end to the tabletop, the at least two extension arms configured to displace the tabletop along the at least one axis of movement as the at least two actuators expand from the contracted first position to the expanded second position.

13. The method of claim 9, further comprising applying a second electrical signal to a third actuator and a fourth actuator of the at least two actuators, wherein the third actuator and the fourth actuator are positioned in a second flexure frame of the at least one flexure frame, the second flexure frame being positioned at approximately 90° to a first flexure frame of the at least one flexure frame and on an adjacent side of the tabletop to the first flexure frame.

14. The method of claim 9, wherein the at least two actuators are configured to produce a compensating differential displacement to offset yaw error as the at least two actuators expand from a contracted first position to an expanded second position.

15. The method of claim 13, further comprising, in response to applying the second electrical signal, measuring a second displacement of the tabletop along a second axis of movement of the at least one axis of movement using a second position sensor of the at least one position sensor, the second displacement comprising a differential displacement between the distal ends of the second flexure frame.

16. The method of claim 15, further comprising, in response to measuring the first displacement and the second displacement, varying the first electrical signal or the second electrical signal.

17. A stage system comprising:
a stationary reference frame;
a tabletop configured to be displaced along at least one axis of movement;
at least one flexure frame having a center affixed to the stationary reference frame and distal ends that are movable with respect to the stationary reference frame;
at least two actuators comprising a first actuator and a second actuator, the at least two actuators each configured to expand from a contracted first position to an expanded second position, the at least two actuators further positioned in the at least one flexure frame at a small angle of deflection from at least one beam of the at least one flexure frame, the first actuator and second actuator having different angles, and each actuator being positioned such that as it expands from the contracted first position to the expanded second position, it expands at least partially along the at least one axis of movement and at least partially away from the other actuator; and
at least two extension arms, each extension arm attached at a first end to the at least one flexure frame and at a second end to the tabletop, the extension arms configured to displace the tabletop along the at least one axis of movement as the at least two actuators expand from the contracted first position to the expanded second position.

18. The stage system of claim 17, the at least two actuators having spherical caps on each end of each actuator or flexure hinges that permit the at least two actuators to rotate as the at least two actuators expand from the contracted first position to the expanded second position.

19. The stage system of claim 18, wherein the at least two actuators expand from the contracted first position to the expanded second position in response to an application of an electrical signal, wherein at least one of the at least two extension arms is attached to each end of the at least one flexure frame, the at least one flexure frame being further configured to deflect the distal ends away from the tabletop as the at least two actuators expand from the contracted first position to the expanded second position.

20. The stage system of claim 19, wherein the at least two actuators are configured to produce a compensating differential displacement to offset yaw error as the at least two actuators expand from the contracted first position to the expanded second position.

* * * * *